(12) United States Patent
Zak et al.

(10) Patent No.: US 7,804,047 B2
(45) Date of Patent: *Sep. 28, 2010

(54) TEMPERATURE SENSOR DIAGNOSTIC FOR DETERMINING WATER HEATER HEALTH STATUS

(75) Inventors: Robert L. Zak, St. Paul, MN (US); Douglas D. Bird, Little Canada, MN (US); Brent Chian, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 353 days.

This patent is subject to a terminal disclaimer.

(21) Appl. No.: 10/997,258

(22) Filed: Nov. 24, 2004

(65) Prior Publication Data

US 2005/0077368 A1  Apr. 14, 2005

Related U.S. Application Data

(63) Continuation-in-part of application No. 10/424,257, filed on Apr. 25, 2003, now Pat. No. 6,959,876, and a continuation-in-part of application No. 10/382,050, filed on Mar. 5, 2003, now Pat. No. 6,701,874, and a continuation-in-part of application No. 10/382,303, filed on Mar. 5, 2003, now Pat. No. 7,317,265, and a continuation-in-part of application No. 10/382,056, filed on Mar. 5, 2003, now Pat. No. 6,955,301.

(51) Int. Cl.
*H05B 1/02* (2006.01)
*F24H 1/18* (2006.01)

(52) U.S. Cl. .............. 219/494; 219/481; 219/490; 392/441; 392/447; 392/463

(58) Field of Classification Search .......... 219/481, 219/492, 497, 494; 392/441, 447, 463; 374/102, 374/107

See application file for complete search history.

(56) References Cited

U.S. PATENT DOCUMENTS

| 4,696,639 A | 9/1987 | Bohan, Jr. |
|---|---|---|
| 4,734,658 A | 3/1988 | Bohan, Jr. |
| 4,770,629 A | 9/1988 | Bohan, Jr. |
| 4,984,981 A | 1/1991 | Pottebaum |
| 5,206,819 A * | 4/1993 | Illing .................. 700/276 |
| 5,660,328 A | 8/1997 | Member |

(Continued)

FOREIGN PATENT DOCUMENTS

JP  2000297964 A  * 10/2000

*Primary Examiner*—Stephen J Ralis

(57) ABSTRACT

A method and apparatus for determining a health status of a water heating device is disclosed. The water heating device may have a controller that incorporates logic to regulate the heater responsive to water temperatures detected at different areas within the water heating device by first and second sensors. Unfortunately, the first and second sensors may fail. To detect fault conditions or otherwise determine the heath status of the water heating device, a logic unit in the controller may perform a test on the first and/or second sensors so as to provide a test output. The logic unit may also determine whether the test output satisfies one or more predetermined thresholds. These predetermined thresholds may be indicative of a properly-functioning sensor. When the test output does not satisfy the at least one predetermined threshold, the logic unit may then set a fault condition indicative of improperly functioning sensors.

7 Claims, 9 Drawing Sheets

U.S. PATENT DOCUMENTS

| | | |
|---|---|---|
| 5,797,358 A | 8/1998 | Brandt et al. |
| 6,261,087 B1 | 7/2001 | Bird et al. |
| 6,293,471 B1 | 9/2001 | Stettin et al. |
| 6,350,967 B1 * | 2/2002 | Scott .......................... 219/497 |
| RE37,745 E | 6/2002 | Brandt et al. |
| 2001/0009609 A1 * | 7/2001 | Bradenbaugh .............. 392/463 |
| 2001/0031138 A1 | 10/2001 | Troost, IV |
| 2002/0132202 A1 | 9/2002 | Clifford |
| 2004/0065095 A1 * | 4/2004 | Osborne et al. ............... 62/160 |

* cited by examiner

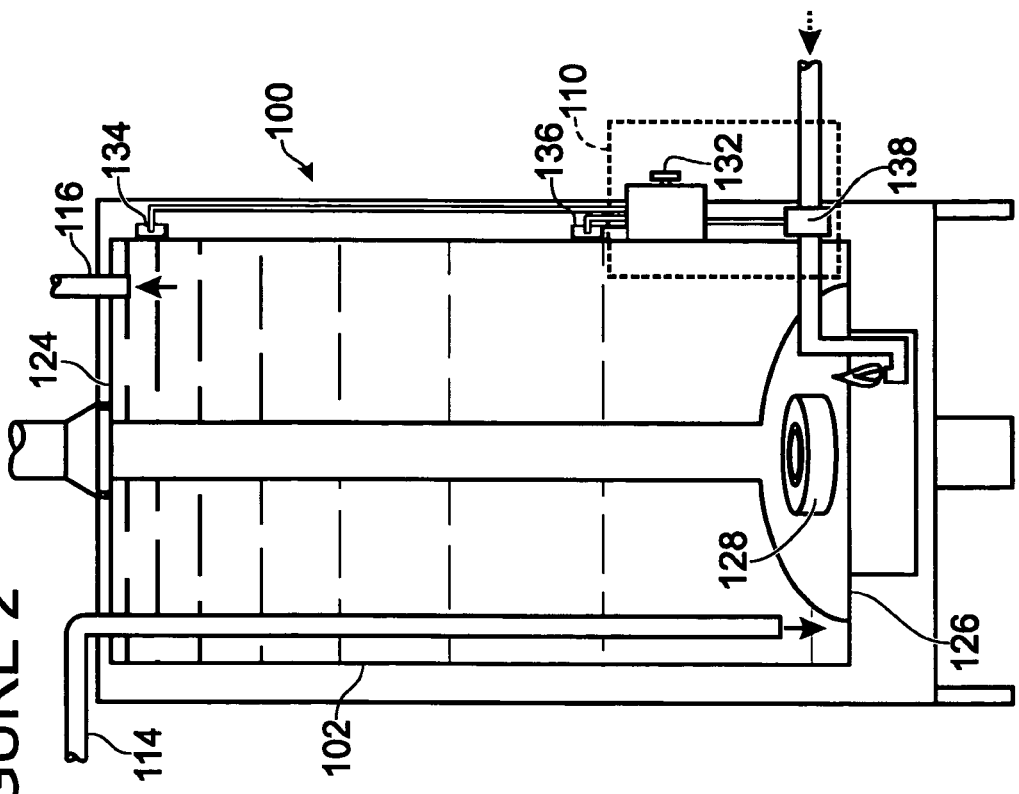
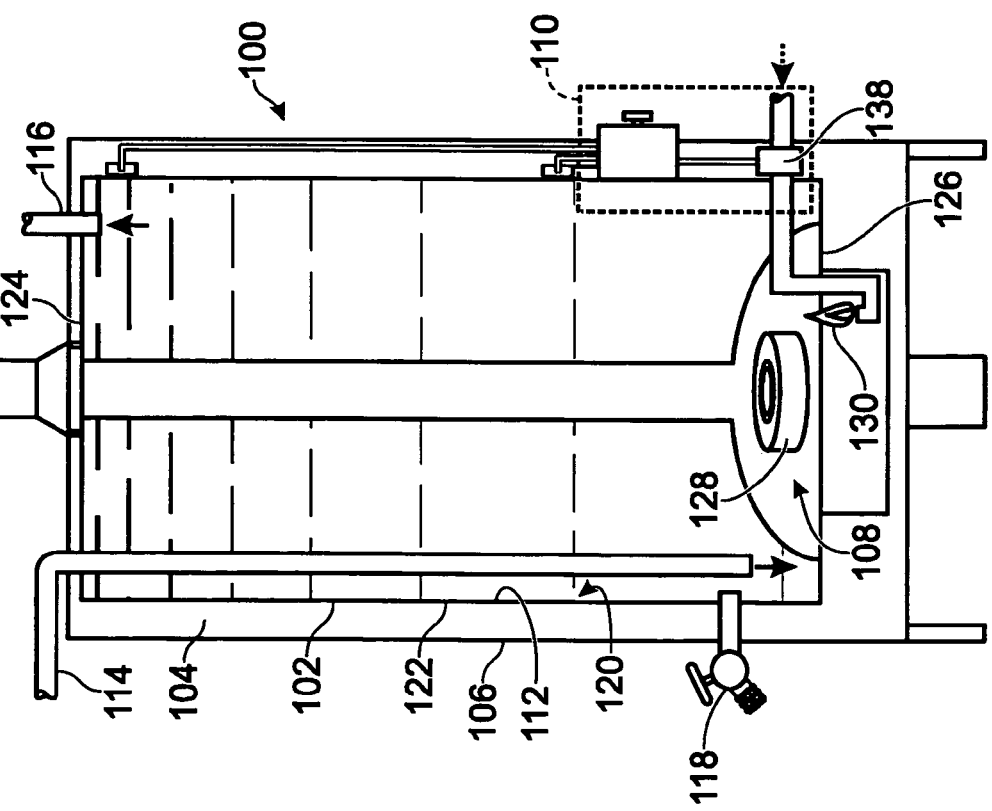

SENSOR-FAILURE TEST

Sensor-Matching Test

Sensor-Contact Test

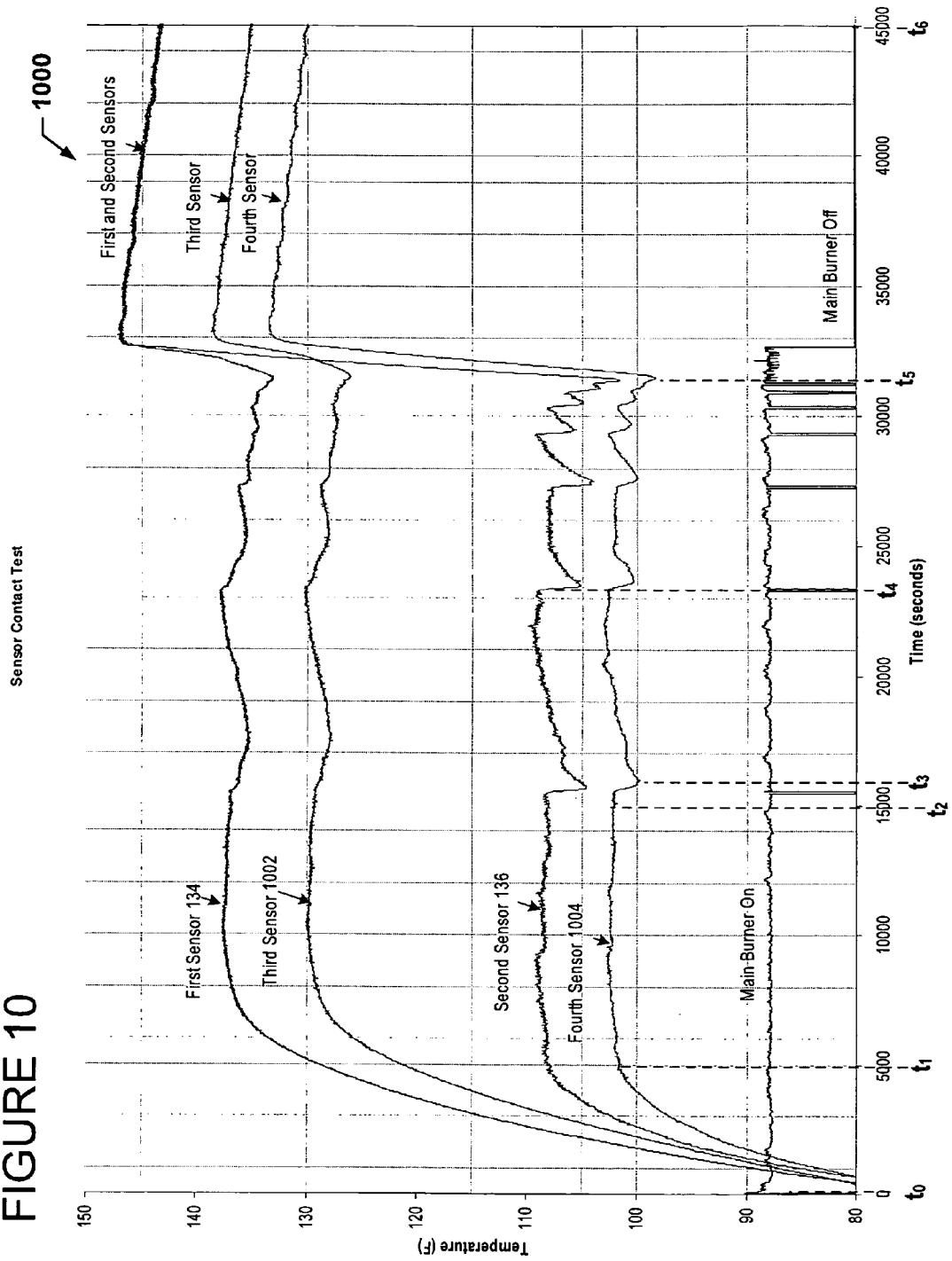

TEMPERATURE SENSOR DIAGNOSTIC FOR DETERMINING WATER HEATER HEALTH STATUS

RELATED APPLICATIONS

The present application is a continuation-in-part of U.S. patent application Ser. Nos.:
(1) 10/424,257, filed Apr. 25, 2003, entitled "Method and Apparatus for Safety Switch;"
(2) 10/382,050, filed Mar. 5, 2003, entitled "Method and Apparatus for Thermal Power Control;"
(3) 10/382,303, filed Mar. 5, 2003, entitled "Method and Apparatus for Power Management;" and
(4) 10/382,056, filed Mar. 5, 2003, entitled "Water Heater and Control" all of which are assigned to the same assignee as the present application, and fully incorporated herein by reference.

Further, the present application incorporates herein by reference U.S. patent application Ser. No. 09/745,686, filed Jan. 3, 2000, entitled "Hot Water Heater Stacking Reduction Control," which is assigned to the same assignee as the present application.

BACKGROUND

1. Field of the Invention

The following relates to water heating devices, and more particularly to a water heater having (i) at least two sensors, each of which are operable to provide an output signal indicative of a water temperature, and (ii) sensor diagnostics for determining a health status of the water heater.

2. Description of Related Art

Water heaters are used in homes, businesses and just about any establishment having the need to heat water. Water heaters heat water using the simple "heat rises" principle. In operation, water heaters heat cold or ambient temperature water entering at or near the bottom of the water heater to a desired temperature using a gas-fired burner, an electric heater or some other form of energy.

During a heating cycle, the cold or ambient temperature water at the bottom of the water heater becomes hotter and begins to rise towards the top of the water heater. Denser water, once on top of the water being heated, falls toward the bottom of the water heater so that it can be heated to the desired temperature. After the temperature of the water at the bottom of the water heater reaches a certain desired temperature, the water heater stops heating the water.

When demand for hot water arises (e.g., someone turns on a faucet to run a shower) fresh, cold or ambient water enters the water heater and "pushes out" or supplies the hotter water at or near the top of the water heater. When a sufficient amount of the hotter water exits from the top of the water heater so that the fresh, cold or ambient water entering the bottom causes the temperature of the water at the bottom of the tank to drop below the desired temperature, the water heater repeats the heat cycling. Alternatively, a heat cycle may occur as a result of the water heater standing idle for an extended period of time.

A conventional water heater typically has at least one heating element or "heater," such as a gas-fired and/or electric burner. To take advantage of the "heat-rises" principle, the heater is located at or near the bottom of the water heater. Each water heater typically also has at least one thermostat or controller for controlling the heater.

To facilitate the heating of water, the controller receives signals related to the temperature of the water. When these signals indicate that the water temperature is below a predetermined threshold, for example, when the water temperature is below 120 degrees Fahrenheit, the controller turns on the heater and the water at or near the bottom of the water heater begins to heat.

After some time, the temperature of the water at the bottom of the water heater increases to a second threshold, which, for example, may be about 140 degrees Fahrenheit. When receiving signals indicating that the water temperature at the bottom of the tank is greater than the second threshold, the controller causes the heater to reduce its heat output or, alternatively, causes the heater to turn off. The heat cycle begins again when the temperature of the water at the bottom of the water heater drops below the first threshold.

Unfortunately, the controller, under certain conditions, may fail to receive reliable, repeatable, reproducible, and/or accurate or acceptable signals corresponding to the temperatures of the water in the water tank 102. These errant signals can affect the efficient operation and possibly the safety of the water heater. Thus, it is desirable to provide a method and system to detect errant signals, correct the errors, and/or terminate the operation of the water heater in an effort to make the water heater more reliable, repeatable, reproducible, and/or accurate.

SUMMARY

A method and apparatus for determining a health status of a water heating device is disclosed. The water heating device may have a combination of a tank for holding water, a heater for heating the water, and a controller having logic to regulate the heater responsive to water temperatures detected by first and second sensors. Each of the sensors detects water temperatures at different areas within the water heating device.

In one embodiment, a logic unit in the controller may carry out the following method for determining the health status of the water heating device. The logic unit may perform a test on at least one of the first and second sensors and responsively provide a test output.

The logic unit may also determine whether the test output satisfies one or more predetermined thresholds. These predetermined thresholds may be indicative of a properly-functioning sensor. When the test output does not satisfy the at least one predetermined threshold, the logic unit may set a fault condition that indicates that the first sensor, second sensor and/or controller may not be functioning properly.

BRIEF DESCRIPTION OF THE DRAWINGS

Exemplary embodiments of the invention are described below in conjunction with the appended figures, wherein like reference numerals refer to like elements in the various figures, and wherein:

FIG. 1 is cutaway view of a water heater according to an exemplary embodiment;

FIG. 2 is a second cutaway view of a water heater according to an exemplary embodiment;

FIG. 10 is a second chart illustrating water temperatures detected by the first and second sensors during an experiment in which an exemplary embodiment of a sensor-contact test is carried out.

DETAILED DESCRIPTION OF EXEMPLARY EMBODIMENTS

1. Exemplary Architecture

Figure 3:
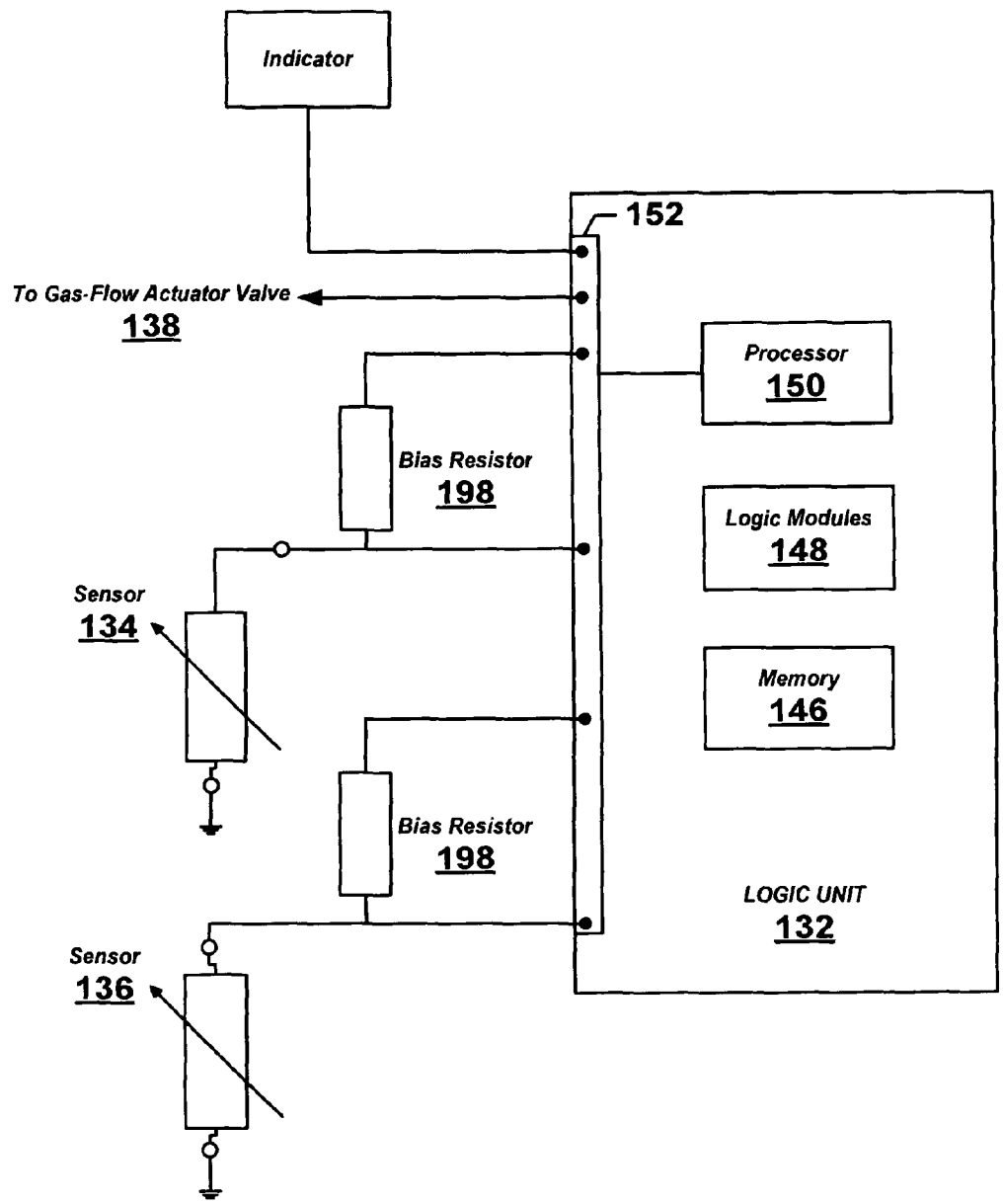
FIG. 3 is a first block diagram illustrating a logic unit of an exemplary controller assembly according to an exemplary embodiment.

FIG. 1 is cutaway view of an exemplary water heating device 100 (hereinafter referred to as a "water heater") in which sensor diagnostics may be deployed. The water heater 100 includes a tank 102, an insulating layer 104, an external shell 106, a heater 108, and a controller assembly 110. The tank 102 holds water that is to be heated and may be constructed of steel or other heat conducting material. The tank 102 has an inner surface 112, an input supply tube or dip tube 114, an output conduit or pipe 116, a drainage valve 118, a rust inhibiting liner 120, and an outer surface 122.

The insulating layer 104 may be located between the outer surface 122 of the tank and the external shell 106. The insulating layer 104 limits or otherwise minimizes the heat loss of the heated water from passing from the tank 102 to the outside world. Bonded to the inside of the inner surface 112 is the rust inhibiting liner 120. In addition, the tank 102 may have a sacrificial anode rod (not shown) to keep the tank 102 from corroding.

The tank 102 also has a top surface 124 and bottom surface 126. Passing through the top surface 124 are the dip tube 114 and the output pipe 116. The output pipe 116 extends through the top surface 124 to a second predetermined distance from the bottom surface 126. This second predetermined distance may be fairly close to the top surface 124. Having the output pipe 116 close to the top surface 124 allows the hotter water, which may be the hottest water in the tank 102, to exit the tank 102 upon demand. In operation, when the hot water is demanded, fresh water flows into the dip tube 114 to the bottom of the tank 102 and pushes or otherwise causes the hotter water at the top of the tank 102 to exit through the output pipe 116.

Like the output pipe 116, the dip tube 114 extends through the top surface 124 to a predetermined distance from the bottom surface 126. This predetermined distance may be fairly close to the bottom surface 126. Having the exit of the dip tube 114 close to the bottom surface allows the fresh, cold or ambient water to enter the tank near the bottom surface 126. This prevents the cold or ambient water from mixing and cooling the hotter water near the top surface 124. In practice, the dip tube 114 may be typically located about three quarters of the distance from the top surface 124 to the bottom surface 126. Because the fresh water entering the tank 102 is denser than heated water, the fresh water sinks to the bottom of the tank 102, where it may be heated.

The heater 108 heats the tank 102, which in turn heats any water inside the tank 102. The heater 108 may be a gas-fired heater, an electric heater, a plurality of gas-fired burners, a plurality of electric heaters, a combination of gas-fired and electric heaters or any other heat source. When called upon, the heater 108 may provide a small amount of heat, a large amount of heat, or no heat at all.

In the exemplary gas-fired water heater shown in FIG. 1, heater 108 may have a gas-flow valve (not shown), a burner 128 and an ignition source 130. The gas-flow valve may be a solenoid-controlled valve, a linear actuated valve, a motor actuated valve, or any other valve capable of supplying gas to the burner 128. The ignition source 130 may be a pilot light, a solid-state igniter, an electric heat element, or any other ignition source capable of igniting gas.

The heat output of the heater 108 may be controlled by burner orifice size, gas pressure, and/or time. To produce heat in the gas-fired water heater, gas flows into the burner 128 through the gas-flow valve, where the ignition source 130 ignites the gas. The gas will continue to burn until the supply of gas is terminated.

In an alternative water heater embodiment (not shown), the heat output may be controlled by an electric current flow through an electric heating element. To produce heat in an electric heater, the amount of current impressed on the electric heating element is regulated. In regulating the heat output, the more current impressed on the electric heating element, the more heat is produced. Conversely, less or no heat is produced if the current is reduced or turned off, respectively.

FIG. 2 illustrates a water heater 100 with a controller assembly 110. For simplicity, hereinafter the controller assembly 110 is described in reference to an exemplary gas-fired water heater. Those skilled in the art will recognize that the controller assembly 110 is not limited to such an embodiment, and other controller assemblies, such as those used with electric water heaters, are possible as well. The controller assembly 110 includes a logic unit 132, a first sensor 134, a second sensor 136, and a gas-flow-valve actuator 138.

FIG. 3 illustrates the logic unit 132 of the controller assembly 110 in more detail. The logic unit 132 may be deployed with memory 146, a set of logic modules 148, a processor 150, a logic-unit interface 152 and programmable instructions for producing an output to actuate the gas-flow valve actuator 138. As those skilled in the art will recognize, the logic unit 132 may have other alternative constructions as well. Details of an exemplary logic unit and controller are provided by U.S. patent application Ser. No. 10/424,257, filed Apr. 25, 2003, and entitled "Method and Apparatus for Safety Switch".

The logic unit 132 receives signals from the first and second sensors 134, 136. Based on those signals, the logic unit 132 may produce an output to initiate a heat cycle. During the heat cycle, the logic unit 132 actuates the gas-flow-valve actuator 138, which in turn opens the gas-flow valve to supply gas to burner 128. When gas is supplied to the burner 128, the logic unit 132 triggers the ignition source 130 to ignite the gas, if the ignition source 130 requires such trigger.

The burner 128 then burns the gas until the demand for heat ceases. Once the heat demand ceases, the logic unit 132 may produce a second output. This second output, in turn, deactivates the gas-flow-actuator 138, thereby shutting off the gas supply and dampening the firing of the burner 128.

The first sensor 134 may be a temperature sensor or another device capable of sensing water temperature at or near the top of the tank 102. Thus, for example, a sensor capable of detecting a property of the water from which the water temperature may be derived (such as infrared) may also be used with the present system. While in an exemplary embodiment the first sensor 134 may be located towards the top surface 124 near the exit opening in the output pipe 116, the sensor need not be physically located at the top of the water heater, provided that the temperature of the water at or near the top is detected by the sensor. In practice, the top sensor may be located from about 4 to about 8 inches from the top surface 124.

The first sensor 134 may provide to the logic unit 132 signals related to the detected water temperature. Alternatively, the first sensor 134 may also incorporate switches and logic modules so as to provide the logic unit 132 with switched signals that relate to the detected water temperature. For instance, in response to the first sensor 134 detecting a hot water temperature that is over a given threshold, one or more of such logic modules may cause one of the switches to open or close, thereby signaling the logic unit 132 that the hot water temperature is over the given threshold. Further, the logic modules may keep the switch in that position so long as the detected temperature is over the given threshold.

Like the first sensor 134, the second sensor 136 may be a temperature sensor or another device capable of sensing water temperature at or near the bottom of the tank 102. In an exemplary embodiment, the second sensor 136 may be located towards the bottom surface 126 and towards the exit of the dip tube 114.

The second sensor 136, however, need not be located in such position; rather all that is required is that the second sensor 136 may sense the water temperature at or near the bottom of the tank. Again, like the first sensor 134, the second sensor 136 may provide to the logic unit 132 signals related to the detected water temperature. Alternatively, the second sensor 136 may also incorporate switches and logic modules so as to provide the logic unit 132 switched signals related to the detected water temperature.

The gas-flow-valve actuator 138 controls the amount of heat delivered by the heater 108. In the exemplary embodiment shown in FIG. 1, the gas-flow-valve actuator 138 controls the opening and closing of the gas-flow valve. When heat is called for, the gas-flow-valve actuator 138 opens the gas-flow valve, which allows gas to flow into the burner 128. When the logic unit 132 sends the gas-flow-valve actuator 138 an indication to stop the gas flow, it closes the gas-flow valve, thereby causing cessation of gas and, in turn, heat.

Details of an exemplary controller assembly 110, water heater deploying the first an second sensors and the operation thereof are provided by U.S. patent application Ser. No. 10/382,056, filed Mar. 5, 2003, entitled "Water Heater and Control". Other controllers, water heaters and alternative operations may be deployed for carrying out the sensor diagnostics as well.

2. Sensor Diagnostics for Determining a Health Status

Referring again to FIG. 3, the logic unit 132, and the first and/or second sensors 134, 136 (show in a voltage and/or current divider arrangement with bias resistor 198) may be used for carrying out sensor diagnostics to determine a health status of the water heater. As noted above, the first and second sensors 134, 136 may be temperature sensors or other device capable of sensing water temperatures. The first sensor 134 may sense the water temperature at or near the top of the tank 102, whereas the second sensor 136 may sense the water temperature or at or near the bottom of the tank 102. Under certain conditions, the first and second sensors 134, 136 may fail to provide reliable, repeatable, reproducible, and/or accurate or acceptable signals corresponding to the temperatures of the water in the water tank 102.

In an exemplary embodiment, each of the first and second sensors 134, 136 may be deployed as a surface-mount Negative-Temperature-Coefficient (NTC) temperature sensor (hereinafter "first and second NTC sensor"). NTC sensors generally decrease in resistance in response to an increase in a temperature being sensed. Thus, the resistance of the first and second sensors 134, 136 may decrease when the temperature of the water in the water tank 102 increases.

Details of an exemplary NTC sensor may be found in the Temperature Sensing Solution Catalog (1999), Thermometrics, Inc., Bowthorpe Company, Crowne Industrial Estate, Priors Woods Road, TAWNTON, SOMERSET UK TA2804, which is incorporated herein by reference. Those skilled in the art will recognize that the first and second sensors 134, 136 are not limited to such an embodiment, and other sensor assemblies, such as Positive-Temperature Coefficient temperature sensors, may be used as well.

To limit offset and sensitivity differences, the first and second sensors 134, 136 may be matched or have substantially the same sensing characteristics. That is, for each temperature in the temperature range, which may be for example, from about 32 to 194 degrees Fahrenheit, both of the first and second sensors 134, 136 (in combination with the logic unit 132) detect substantially the same temperature when exposed to the same temperature. This may be accomplished by selecting sensors that have about the same resistance and/or sensing characteristics throughout the temperature-sensing range. Alternatively, the logic unit 132 may include logic to compensate for differences between the resistance and/or sensing characteristics of the first and second sensors so that they detect substantially the same temperature when exposed to the same temperature.

If, on the other hand, the differences are greater than about few degrees (e.g., 5 degrees) at any one temperature then the first and second sensors 134, 136 may not be considered as a match, and although operational, may not be desirable to deploy together. The difference, however, may be more than or less than this exemplary range.

The logic unit 132 may attempt to keep the water temperature below a certain level, such as 194 degrees Fahrenheit, so as to attempt to prevent potentially dangerous conditions, such as scalding or tank eruption. If either the first or second sensor 134, 136 indicates a temperature outside of the temperature-sensing range, then the sensor so indicating may be considered a non-properly functioning sensor.

For example, if the logic unit 132 (via the voltage divider arrangement) determines that the resistance of the first and/or second sensors 134, 136 indicates temperature outside the 32 to 194 degrees Fahrenheit temperature range, then the logic unit 132 may set a fault condition. Responsive to this fault condition, the logic unit 132 may then (i) halt the water heater from initiating or maintaining a heat cycle, and/or (ii) prevent the water heater from further operation until being serviced and reset. As described in more detail below, the logic unit 132 may also set a fault condition in response to other sensor-diagnostic tests.

A. Test Battery

Figure 4:
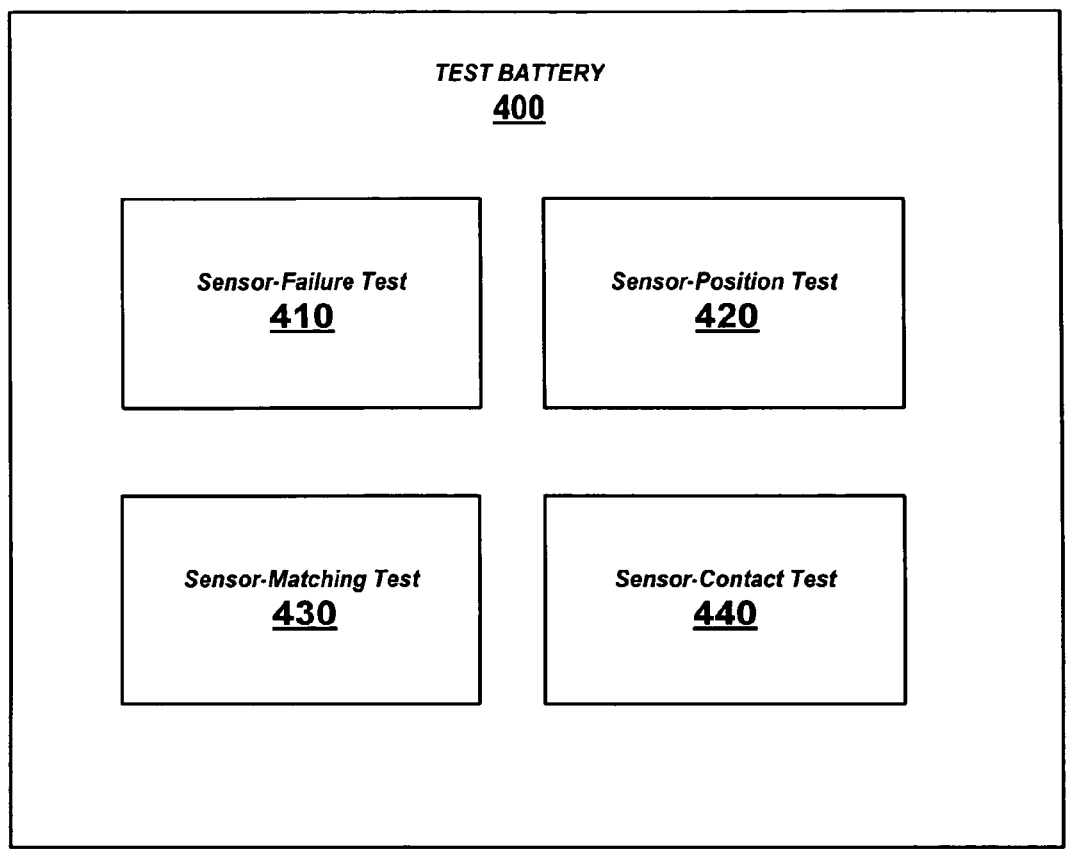
FIG. 4 is a second block diagram illustrating a test battery for deploying sensor diagnostics to determine the health status of a water heater according to an exemplary embodiment.

FIG. 4 is a block diagram showing a test battery 400 for deploying sensor diagnostics to determine the health status of the water heater 100 in accordance with an exemplary embodiment. The test battery 400 may include one or the more sensor-diagnostic tests, such as a sensor-failure test 410, a sensor-position test 420, a sensor-matching test 430, and a sensor-contact test 440. The test battery may include other tests as well. FIGS. 5-7, and 9 are flow charts illustrating exemplary embodiments of these tests.

B. Sensor-Failure Test

Figure 5:
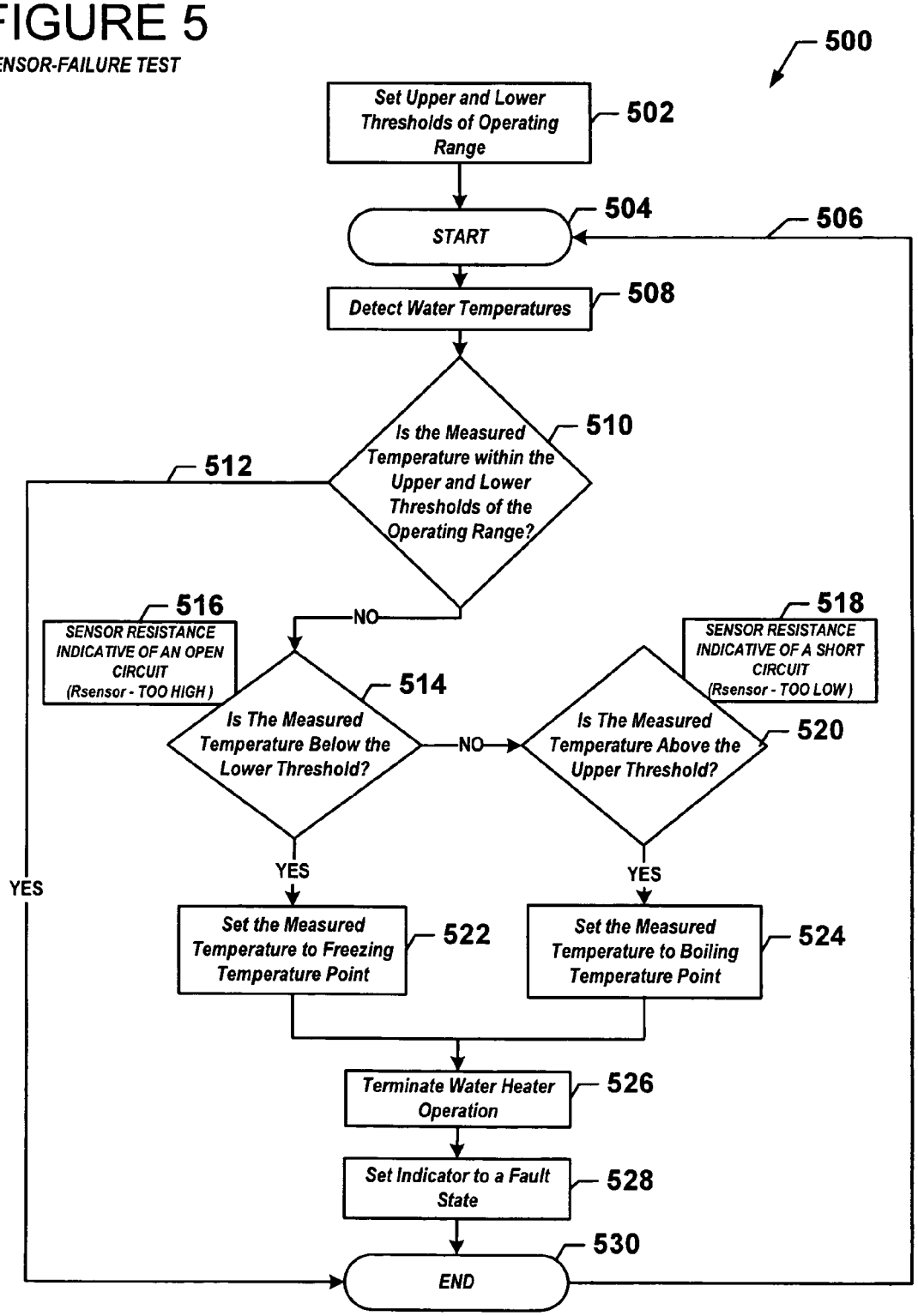
FIG. 5 is a first flow chart illustrating an exemplary embodiment of a sensor-failure test according to an exemplary embodiment.

Referring now to FIG. 5, a flow chart 500 showing an exemplary embodiment of the sensor-failure test 410 in more detail is provided. The sensor-failure test 410 is directed to determining whether or not the first and second sensors 134, 136 have failed or have poor connectivity with the logic unit 132. That is, whether or not the first and/or second sensors 134, 136 operate within an acceptable range of temperatures for the water heater. The first and second sensors 134, 136 may have a plurality of failure modes, which can occur for a multitude of reasons. Some of the failure modes may include the conditions where the sensing element is open, shorted, or intermittently connected; and/or the sensor connection between the logic unit 132 and the sensor is open, shorted, or intermittently connected. This test may also beneficially detect non-functioning or runaway heater conditions.

As an initial condition, the logic unit 132 may be initialized, programmed, and/or hardwired with upper and/or lower thresholds of the water-temperature-operating range as shown in block 502. In the hardwired embodiment, the thresholds may be carried-out using, for example, comparator circuitry (not shown) having applied reference signals that are indicative of the upper and lower thresholds.

The upper threshold or "upper-temperature-limit threshold," may be set at a temperature at which the logic unit 132 may no longer allow heating of the water. This threshold may be set at approximately 194 degrees Fahrenheit, for example. The lower threshold or "lower-temperature-limit threshold," may be set at temperature at which the logic unit 132 is likely to have determined that some part of the water heater has malfunctioned because, for example, the water will not heat. Such a point may be dependent on climate in which the water heater is located or positioned. In colder climate areas, for instance, the lower-temperature-limit threshold may be set at approximately the freezing point of water or approximately 32 degrees Fahrenheit.

At block 504, the sensor-failure test 410 begins. The sensor-failure test 410 may be performed on cyclical basis as shown by the return path 506. The sensor-failure test 410, however, may be performed in single shot or non-periodic form as well. At block 508, the logic unit 132 may detect the water temperatures sensed by the first and/or second sensors 134, 136.

The logic unit 132 may then determine whether the temperature detected by the first and second sensors 134, 136 is within the operating range of temperatures as shown in decision block 510. That is, the logic unit 132 may compare the temperatures detected by the first and/or second sensors 134, 136 against the lower-temperature-limit and the upper-temperature-limit thresholds. If the temperatures detected by the first or second sensors 134, 136 are within the lower-temperature-limit and upper-temperature-limit thresholds, then the logic unit 132 may not set a fault condition. Responsively, the sensor-failure test 410 may continue on to the end of the test 530 as shown in path 512.

If, on the other hand, either the first or second sensors 134, 136 are not within the lower-temperature-limit to upper-temperature-limit thresholds, then the first and/or second sensors 134, 136 may be tested to determine which one of the thresholds they may have failed. For instance, if the water temperatures sensed by the first and/or second sensor 134, 136 are less than the lower-temperature-limit threshold as shown in decision block 514, then the logic unit 132 may set the fault condition. As shown in block 522, the logic unit 132 may responsively override or substitute the lower-temperature-limit threshold or other appropriate temperature for the detected temperature. In one embodiment, the logic unit 132 may substitute for the detected temperature a temperature at or slightly above the freezing point of water.

One of the failure modes that is indicative of the condition when the temperatures that are detected by the first and/or second sensors 134, 136 falls below the lower-temperature-limit threshold is shown in block 516. In this failure mode, the resistance of the sensing elements of the first and/or second sensors 134, 136 may be too high and/or the sensing element is an open circuit. Another of the failure modes for this condition may be the mode in which the resistance of the pathway between the logic unit 132 and the first and/or second sensors 134, 136 is too high and/or contains an open circuit.

Another failure mode is shown in block 518. In this failure mode, however, the resistance of the sensing elements of the first and/or second sensors 134, 136 may be too low and/or the sensing element is a short circuit. Alternatively, this condition may be a mode in which the pathway between the logic unit 132 and the first and/or second sensors 134, 136 is short circuited to ground.

To detect such as condition, the logic unit 132 may determine whether the temperatures that are detected by the first and/or second sensors 134, 136 rise above the upper-temperature-limit threshold as shown in decision block 520. If the temperatures detected by the first and/or second sensor rise above the upper-temperature-limit threshold, the logic unit 132 may set the fault condition. Responsively, the logic unit 132 may override or substitute the upper-temperature-limit threshold or other appropriate temperature for the detected temperatures as shown in block 524. In one embodiment, the logic unit 132 may substitute a temperature at or slightly below the boiling point of water for the detected temperature.

Following the flow of the sensor-failure test 410, after substituting the lower-temperature-limit and/or upper-temperature-limit thresholds, the logic unit 132 may then (i) halt the water heater from initiating or maintaining a heat cycle, and/or (ii) prevent the water heater from further operation until being serviced and reset as shown in block 526. In block 528, the logic unit 132 may then set a fault indicator module to a fault state. The fault indicator module may be deployed as an illuminating indicator, which can illuminate when the fault condition is set. The illuminating indicator, however, may illuminate when the fault condition is not set, and then dim when the fault condition is set.

The indicator module may also be deployed as an audible indicator, a combination of audible and illuminating indicator, a user interface, or other indicating device. The indicator may be employed in a network scheme, for instance. In one such scheme, the logic unit 132 may be integrated or integral to one or more network devices so as to allow a central, remote and/or distributed network of devices to indicate that the water heater is in a faulted state. Such a scheme may enable real-time or near-real-time detection of the faulted conditions.

The above-described embodiment of the sensor-failure test 410 is provided for exemplary purposes only. Those skilled in the art will recognize that the sensor-failure test 410 may be carried out in a different manner, using more or less steps, and in a different order than presented. Moreover, the substituted temperatures may differ from the examples provided and may or may not be the same for both the first and second sensors 134, 136.

C. Sensor Position Test

Figure 6:
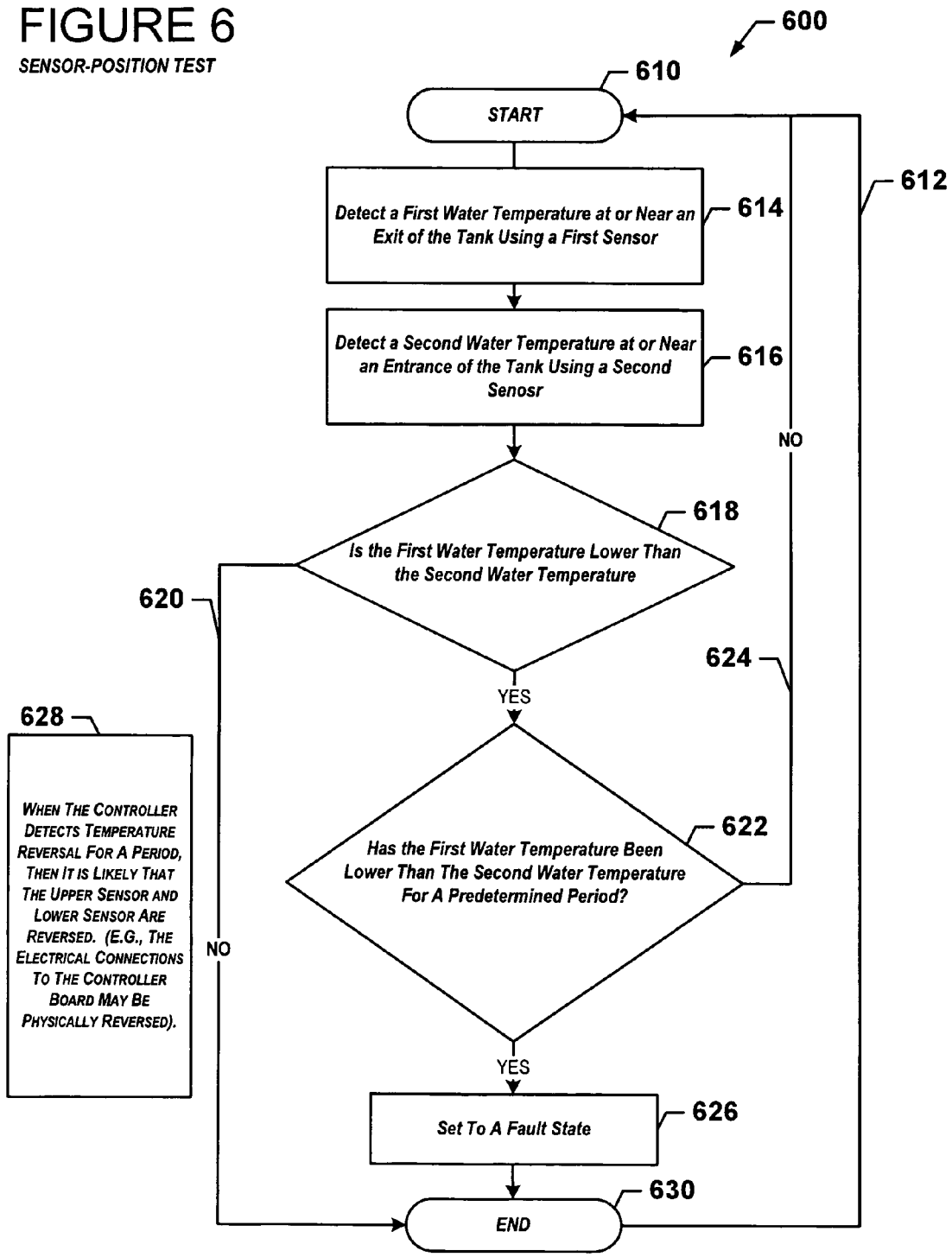
FIG. 6 is second flow chart illustrating an exemplary embodiment of a sensor-position test according to an exemplary embodiment.

FIG. 6 is flow chart 600 illustrating an exemplary embodiment of the sensor-position test 420. The sensor-position test 420 is directed to determining whether or not the first and second sensors 134, 136 have been installed or connected in the incorrect order or if the first sensor 134 has sufficient contact with the tank 102. That is, the sensor-position test 420 may determine whether the first sensor 134 has been installed at the bottom instead of the top of the tank 102 and/or connected to the logic-unit interface 152 where the second sensor 136 should be connected.

Conversely, the sensor-position test 420 may determine whether the second sensor 136 has been installed at the top instead of the bottom of the tank 102 and/or connected to the logic-unit interface 152 where the first sensor 134 should be connected. This test may also detect a mismatched sensor pair, and/or a failed second sensor 136 as indicated by low-temperature readings at the second sensor 136.

Like the rest of the test battery 400, the sensor-position test 420 may be performed as a standalone test, integrated with another test in the test battery 400, and/or integral to another test in the test battery 400. In the present context, integrated merely means that the tests are included into a larger test system and/or sequence. Integral architecture, on the other hand, merely means that the tests and functions thereof are commingled with other parts of a larger test system and/or sequence.

Moreover, the sensor-position test 420 may be carried out before, after, and/or in a logical sequence with other tests in the test battery 400. For example, the sensor-position test 420 may be performed after the sensor-failure test 410 to ensure that the sensor-position test 420 is performed with properly functioning sensors. The sensor-position test 420 may be performed when the water heater is installed as well as when any service is performed on the water heater. The sensor-position test 420 might not be performed on a continuous basis.

Referring now to FIG. 6 at block 610, the sensor-position test 420 is started. Like the other tests, the sensor-position test 410 may be performed on cyclical basis as shown by the return path 612. The sensor-position test 420, however, may be performed in single shot or non-periodic form as well.

At block 614, the logic unit 132 may detect a first water temperature using the sensor connected to the logic-unit interface 152 where the first sensor 134 is supposed to be attached. The first water temperature should be indicative of the temperature of the water at or near an exit of the tank 102. Using what is believed to be the second sensor 136, the logic unit 132 may detect a second water temperature, which should be indicative of the temperature of the water at or near the entrance of the tank 102, as shown in block 616.

After detecting the first and second water temperatures, the logic unit 132 compares the first water temperature to the second water temperature, and determines if the first water temperature is less than the second water temperature as shown in decision block 618. If the first water temperature is greater than or equal to the second water temperature (taking into account a few degree mismatch between the first and second sensors 134, 136, as noted above), then the remaining steps of sensor-position test 420 may be skipped, and the logic unit 132 can jump to the end of the test 630 as shown by path 620.

If, however, the first water temperature is less than the second water temperature, then the logic unit 132 continues to perform the test to determine whether the first water temperature has been less than the second water temperature for a predetermined period of time, as shown in decision block 622. This predetermined period of time may be, for example, a couple seconds, a few minutes, a few hours, a few days, etc. If the first water temperature has not been less than the second water temperature for the predetermined period, then logic unit 132 returns to the start of the sensor-position test 420 as shown in return path 624, and then cyclically repeats steps 610-622.

The logic unit 132 may implement a timer to carry out the step shown in block 620. The timer may be deployed to count either decrementing from or incrementing toward the predetermined time before returning to the start block 310. Alternatively, the logic unit 132 may implement a counter to carry out the step shown in block 620. The counter may count either decrementing from or incrementing toward a pre-selected number of times the logic unit 132 repeats a loop. In this case, the loop may be steps 610-622.

If the first water temperature remains less than the second water temperature for the predetermined period of time, then the logic unit 132 may set a fault condition and as shown in block 626. The logic unit 132 may then (i) halt the water heater from initiating or maintaining a heat cycle, and/or (ii) prevent the water heater from further operation until being serviced and reset. The logic unit 132 may then set the fault indicator module to a fault state.

As shown in notation block 628, when the first water temperature is less than the second water temperature for the predetermined period of time, it is likely that the upper sensor and lower sensors 134, 136 are reversed. This reversal can occur as a result of an incorrect physical mounting, reversed connections to the logic-unit interface 152, and/or other conditions.

D. Sensor-Matching Test

Figure 7:
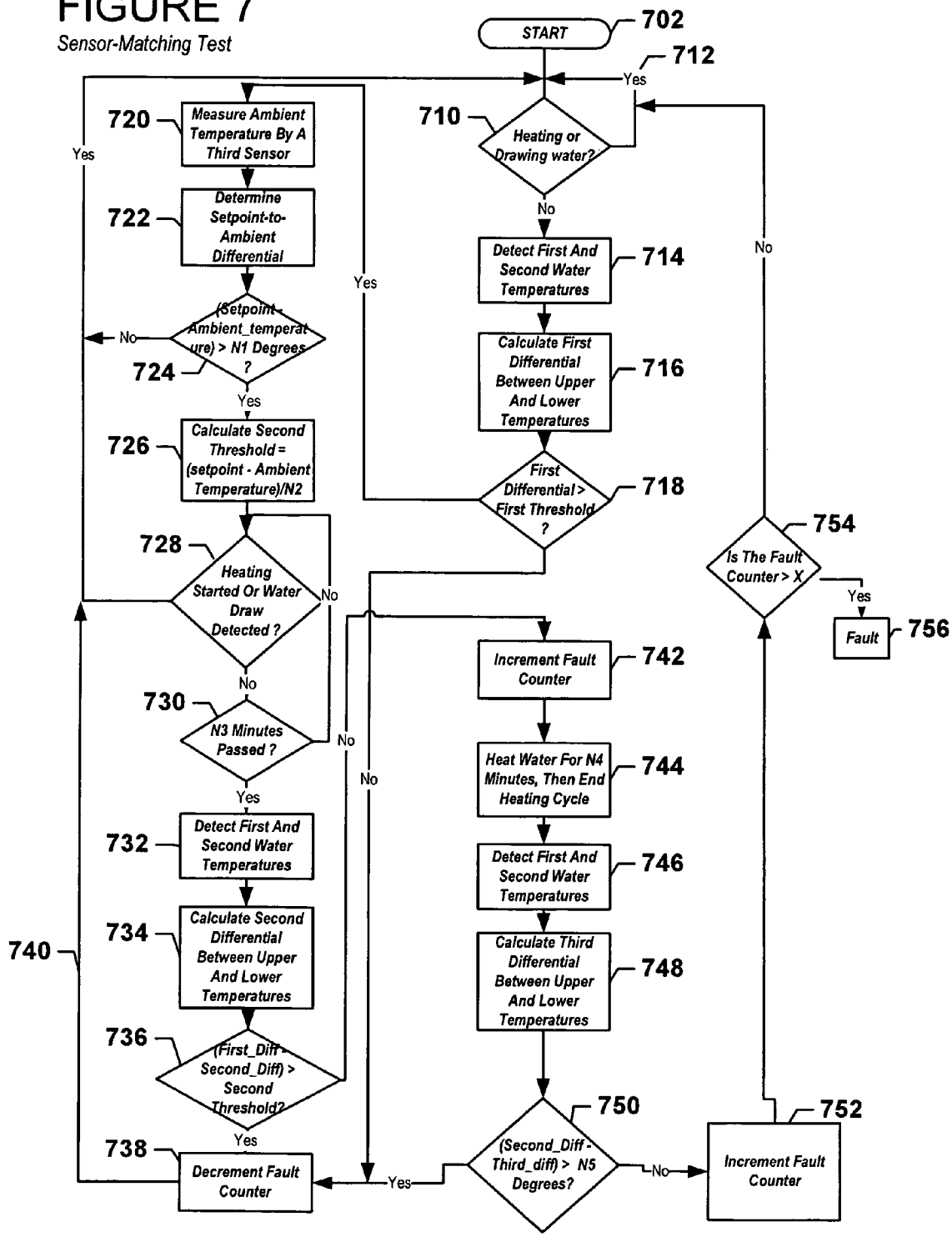
FIG. 7 is a third flow chart illustrating an exemplary embodiment of a sensor-matching test according to an exemplary embodiment.
Figure 8:
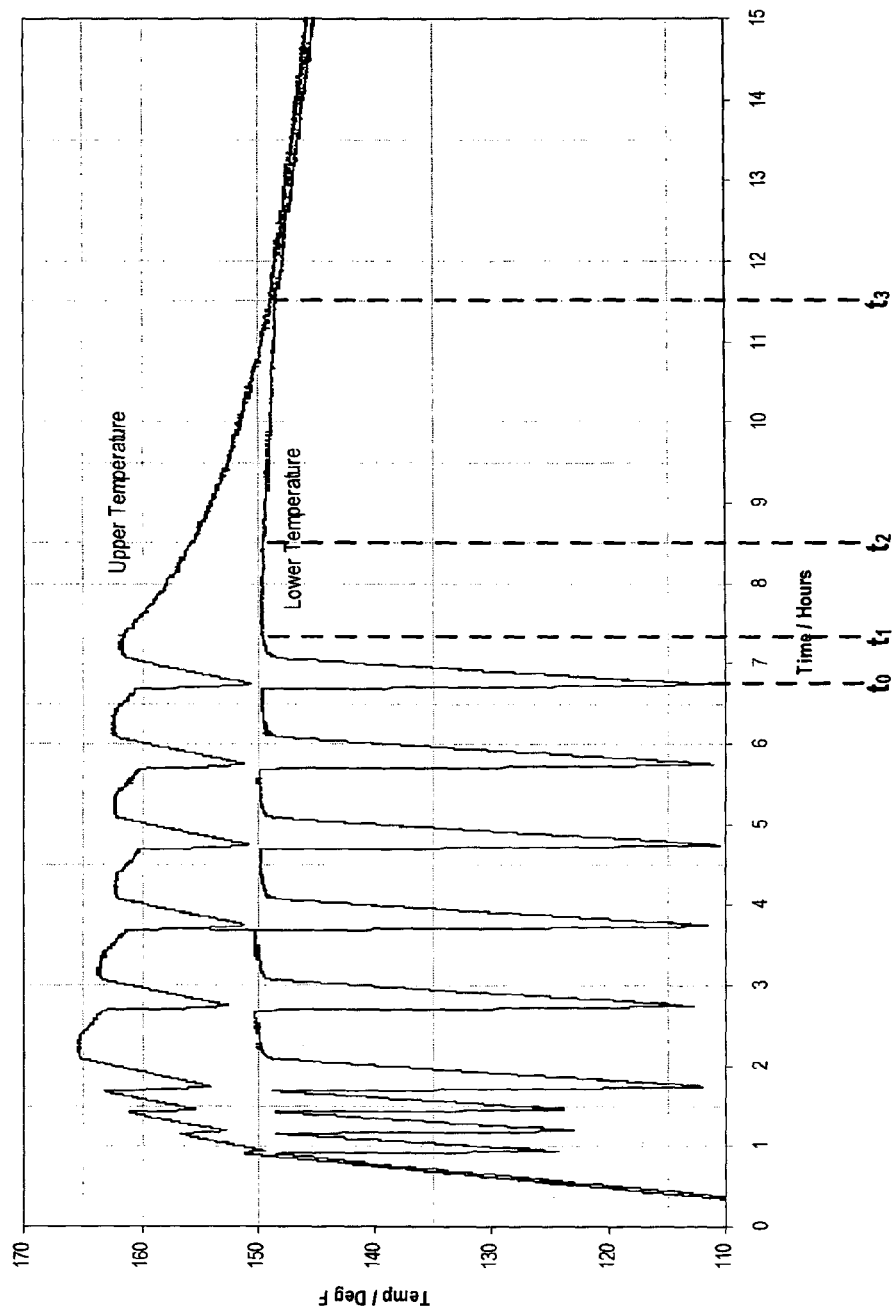
FIG. 8 is a first chart illustrating water temperatures detected by first and second sensors during an experiment in which an exemplary embodiment of a sensor-matching test is carried out according to an exemplary embodiment.

FIG. 7 is a flow chart 700 illustrating an exemplary embodiment of the sensor-matching test 430. The sensor-matching test 430 is directed to uncovering and overcoming one or more failure modes of the first and second sensors 134, 136. FIG. 8 is a chart illustrating water temperatures detected by the first and second sensors 134, 136 during an experiment in which an exemplary embodiment of the sensor-matching test 430 is carried out. While the sensor-matching test 430 may be carried out in various ways, the chart illustrated in FIG. 8 may be referenced in combination with the description of the sensor-matching test 430 shown in FIG. 7.

The failure modes revealed by the sensor-matching test 430 may include (i) a drift-failure mode in which the resistance of at least one of the sensor elements electrically drifts from previous conditions or becomes unstable; (ii) a sensor-contamination mode in which at least one of the sensor elements experiences a reduction or change in resistance because of humidity and/or contamination; (iii) a bias-contamination mode in which the bias resistor 198 experiences a reduction or change in resistance because of humidity and/or contamination; (iv) a contact-resistance mode in which the first and/or second sensor 134, 136 experiences an increase or change in contact resistance; and/or (v) other modes that may be detected using a differential between the water temperatures detected by the first and second sensors.

The sensor-matching test 430 may be performed as a standalone test, integrated with another the tests in the test battery 400 and/or integral to another of the tests in the test battery 400. The sensor-matching test 430 may be carried out before, after and/or in a logical sequence with other tests in the test battery 400. For example, the sensor-matching test 430 may be performed after the sensor-failure test 410 and sensor-position test 420 to ensure that sensor-matching test 430 is performed with properly functioning sensors.

Alternatively, the sensor-matching test 430 may be interspersed during the normal operation of the water heater. It may be, for example, carried out during the middle of the night or other time in which there is not a usual demand for water. In addition, the sensor-matching test 430 may be performed on a continuous basis, which may provide a predictive indicator of potential catastrophic failure of the water heater.

As noted above, the first and second sensors 134, 136 may (i) be matched, (ii) have substantially the same sensing characteristics or (iii) have the differences therebetween compensated for by the logic unit 132 or another device. This beneficially allows the sensor-matching test 430 to determine the failure modes noted above and allow for automatically correction or calibration in response.

The sensor-matching test 430 may be based on the premise that the large temperature differential between the first and second sensors 134, 136 after a heat cycle will reduce at a certain rate (depending on the ambient temperature and insulation of the water heater) when the water heater is idle, i.e., not experiencing heat or a water draw for a period of time. In practice, the large temperature differential may be reduced to a couple of degrees Fahrenheit when the idle time is long enough (typically between 2 to 10 hours).

The sensor-matching test 430 may thus advantageously use the difference between the large temperature differential after a heat cycle and the temperature differential after an idle time to detect the failure modes listed above. The difference between the temperature differentials may not only be a linear difference over time, but also some other function of the difference over time. This function can vary depending on the physical characteristics, e.g., the insulation, of the water heater.

Referring now to FIG. 7 at block 702, the sensor-matching test 430 is started. At block 710, the logic unit 132 tests if a heating cycle or water draw is occurring. In FIG. 8, the initiation of a heating cycle may be found, for example, at time $t_0$ and the completion of a heating cycle may be found at, for example, time $t_1$ (taking into account any residual heating effects after the heater 108 is turned off).

The heating cycle may be initiated independently of or in response to a water draw. When a water draw occurs, the water temperature at the top and bottom of the tank 102 may differ greatly as shown at time to in FIG. 8. This difference may result from (i) the water entering the tank 102 may be at an ambient temperature, which can range from just above freezing to 100 degrees Fahrenheit; and (ii) the target or setpoint temperature for the water exiting the tank 102, which may be at about 150 degrees Fahrenheit. At this point, the water temperature at the bottom and top of the tank 102 may be at its maximum differential, which in this example is approximately 50 degrees Fahrenheit.

At some time between time $t_0$ and time $t_1$, the heat cycle completes. But due to residual heating effects after the heat cycle completes, the sensor-matching test 430 waits a predetermined amount of time to allow the residual heating effects to subside so as to lessen erroneous increases in the large temperature differential.

If, at block 710, the sensor matching test 430 detects that a heat cycle is occurring, the sensor-matching test 430 may be aborted, cancelled, and/or suspended, as shown by return path 712. If, on the other hand, the heating cycle is not occurring (e.g., time $t_1$ in FIG. 8), the logic unit 132 may detect first and second water temperatures using the first and second sensors 134, 136, respectively, as shown in block 714. Using these water temperatures, the logic unit 132 then determines and/or calculates a first temperature differential as shown in block 716. The first temperature differential may be either a signed or an absolute value. In the example in FIG. 8, the first temperature differential is about 12 degrees Fahrenheit.

In decision block 718, the logic unit 132 determines whether the first temperature differential satisfies (e.g., is greater than) a first differential threshold. The first differential threshold may be, for example, a fixed number between 5 and 9 degrees Fahrenheit. Alternatively, the first differential threshold may be set to a value indicative of the condition where the first temperature differential is large enough to measure a rate of change in the water temperature.

If the first temperature differential does not satisfy the first differential threshold, then the test 430 jumps to block 738. At block 738, the logic unit 132 decrements a fault counter (if not already at zero), and then returns back to the start block 702 via return path 740. If, conversely, the first temperature differential satisfies the first differential threshold, then the logic unit 132 may detect an ambient temperature using a third sensor (not shown).

In block 722, a setpoint-to-ambient differential is determined between the setpoint temperature and the ambient temperature. Based, in part, on the insulation, pilot burning rate, etc. of the water heater 100, the cooling rate of the water in the water heater may be substantially, linearly related to the setpoint-to-ambient differential. At block 724, a test is performed to determine if the setpoint-to-ambient differential is greater than a setpoint-to-ambient ("N1") threshold.

If the setpoint-to-ambient differential is less than the N1 threshold, then the cooling rate of the water in the water heater 100 may be too slow to carry out the sensor-matching test 430. In such case, the logic unit 132 may abort the sensor-matching test 430, and return to start at block 702 via return path 740.

If on the other hand, the setpoint-to-ambient differential is greater than the N1 threshold, then a second differential threshold may be determined or calculated, as shown in block 726. This second temperature differential may be, for example, a fraction of the setpoint-to-ambient differential.

At block 728, the logic unit 132 again tests if a heating cycle or water draw is occurring. If, at block 728, the sensor matching test 430 detects that a heat cycle is occurring, then the sensor-matching test 430 may be aborted, cancelled, and/or suspended, as shown by return path 740. Otherwise, the sensor-matching test 430 transitions to decision block 730.

At decision block 730, the logic unit 132 tests if a first predetermined period has passed. This first predetermined period may be empirically or otherwise set to a value long enough to allow the water temperatures detected by the first and second sensors 134, 136 (in a properly operating water heater) to be at about the same temperature. The first predetermined period may be, for example, 70 minutes, as shown between times $t_1$ and $t_2$ in FIG. 8.

Alternatively, the first predetermined period may be set to any number of seconds, minutes, hours, days, etc. The duration of the first predetermined period may depend on the setpoint temperature, duration and occurrence of the last heating cycle, and other factors affecting the decay rate of the water within the tank 102.

If, at decision block 730, the logic unit 132 detects that the first predetermined period has not passed, then the sensor-matching test 430 returns to block 728. The sensor-matching test 430 then repeat blocks 728 and 730 until the first predetermined period has passed. After the first predetermined period has passed and a heating cycle or water draw are not occurring, the logic unit 132 again detects first and second water temperatures using the first and second sensors 134, 136, respectively, as shown in block 732.

Using these water temperatures, the logic unit 132 then determines and/or calculates a second temperature differential, as shown in block 734. Like the first temperature differential, the second temperature differential may be either signed or an absolute value. The logic unit 132 then determines whether the first temperature differential minus the second temperature differential satisfies (e.g., is greater than) the second differential threshold, as shown in decision block 736.

The second differential threshold may be set to value indicative of a small difference in the water temperatures. For instance, the second differential threshold may be set between about ¼ to about 4 degrees Fahrenheit. If the first temperature differential minus second temperature differential satisfies the second differential threshold, then the test 430 transitions to block 738. At block 738, the logic unit 132 decrements the fault counter (if not at zero), and then returns back to the start block 702 via return path 740 indicating that the first and second sensors 134, 136 are correctly matched.

Otherwise, the fault counter is incremented as shown in block 742. The logic unit 132, at block 744, responsively initiates a heat cycle for a second predetermined period, and then terminates the heat cycle. This second predetermined period may be (i) based on the operation of a properly operating water heater, and (ii) set to a value long enough to allow the heating effect to be detected by the first and second sensors 134, 136. The second predetermined period may be, for example, 3 minutes. Alternatively, the second predetermined period may be set to any number of seconds, minutes, hours, days, etc.

At end of the heat cycle, the logic unit 132 once again detects first and second water temperatures using the first and second sensors 134, 136, respectively, as shown in block 746. In block 748, a third temperature differential is determined or calculated using the latest set of the first and second water temperatures. At decision block 750, if the third temperature differential is less than the second temperature differential by a predetermined number of degrees, e.g., 1 degree Fahrenheit, the behavior of the water heater 100 is considered acceptable, and the process continues to block 738.

As above, the fault counter is decremented (if not already zero) at block 738, and then passed to the start 702 via the return path 740. Otherwise, the fault counter is incremented at block 752. At decision block 754, the logic unit 132 performs a test to determine if the fault counter is greater than a fault threshold, e.g., a fixed number of 5.

If the fault counter satisfies or exceeds the fault threshold, the logic unit 132 sets a fault condition. The logic unit 132 may then (i) halt the water heater from initiating or maintaining a heat cycle, (ii) prevent the water heater from further operation until being serviced and reset, and/or (iii) set the fault indicator module to a fault state. Alternatively, the logic unit 132 may abort and return to the sensor-matching test 430 at a later time. On the other hand, if the fault counter is less than the fault threshold, the sensor-matching test 430 returns to the start 702 via return path 758.

The above-described embodiment of the sensor-matching test and 430 is provided for exemplary purposes only. Those skilled in the art will recognize that the sensor-matching test 430 may be in carried out in a different manner, using more or less steps, and in a different order than presented. Further, the target or setpoint temperature differential threshold, the setpoint-to-ambient threshold, the second differential threshold, the first predetermined period, and/or the second predetermined period may differ from the examples provided.

E. Sensor Contact Test

Figure 9:
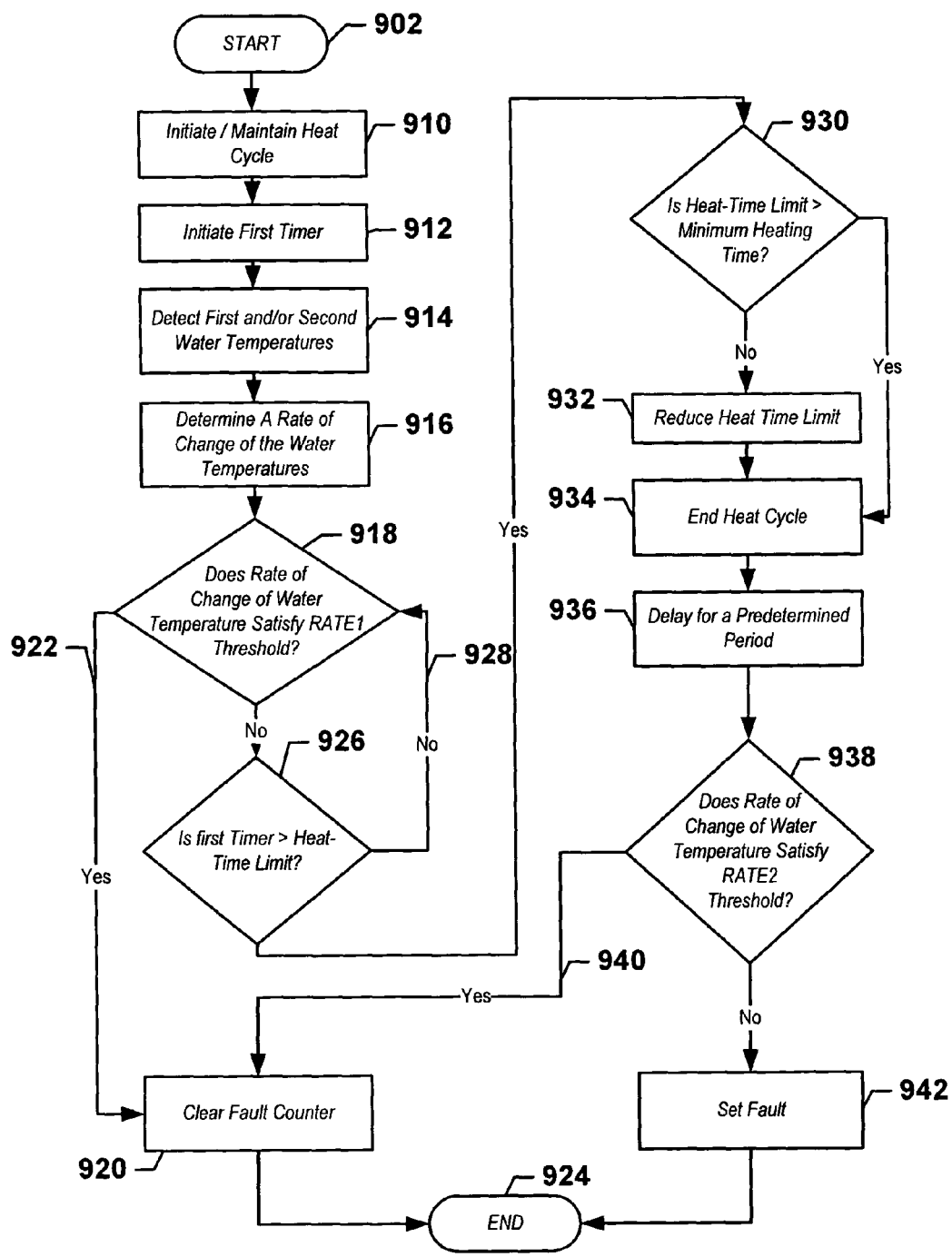
FIG. 9 is fourth flow chart illustrating an exemplary embodiment of a sensor-contact test according to an exemplary embodiment.

FIG. 9 is flow chart 900 illustrating an exemplary embodiment of the sensor-contact test 440. The sensor-contact test 440 is directed to uncovering one or more failure modes of the first and second sensors 134, 136 relating to the loss of physical contact of the first and second sensors 134, 136 from the water tank 102.

When either of the first and second sensors 134, 136 lose all or a portion of their physical contact with the tank 102, then the logic unit 132 may detect a temperature rate of change that is lower than expected. That is, the temperature rate of change may be different from when the first and second sensors 134, 136 are in physical contact with the water tank 102.

A similar effect can occur, however, when the water heater 100 experiences a water draw that matches its heating rate. For example, this condition may occur when the water heater 100 experiences a slow and steady water draw over a long period. Thus, the heating effect of a heat cycle may be mitigated by the cooling effect resulting from the water draw, which results in a small or no rate of change during a heating cycle. The following is directed to determining whether a small or no temperature rate of change during a heating cycle is caused by either or both of the first and second sensors 134, 136 losing loosing contact with the tank 102.

Referring now to FIG. 9 at block 902, the sensor-contact test 440 is started. At block 910, the logic unit 132 may initiate a heating cycle. At block 912, the logic unit 132 initiates a first timer. This first timer may be used to control the duration of the heat cycle. The logic unit 132 then detects a plurality of first water temperatures using the first sensor 134, and/or a plurality of second water temperatures using the second sensor 136, as shown in block 914.

In block 916, the logic unit 132 determines at least one rate of change of the first and/or second water temperatures (hereinafter "first heating rate"). This first heating rate may be linear, logarithmic or other function of the water temperatures over time, and may be any of (i) a rate of change of the first water temperatures; (ii) a rate of change of second water temperatures, and/or (iii) a rate of change of the combined first and second water temperatures. This way, the sensor-contact test 440 can determine if the first or second sensor 134, 136 fail on an individual basis, or simply, determine if the combination of the first and second sensors 134, 136 fails.

In decision block 918, the logic unit 132 may compare, for example, an absolute value of the first heating rate to a first expected-heating-rate ("RATE1") threshold; although only a single sided thresholding may be used. The RATE1 threshold may be a function of historical and/or current maximum heating rates of the water heater 100. Typically, these heating rates may be used to adjust the normal operation of the water heater. Updating the heating rates allow the water heater to react to an imperfect environment of highly variable, volatile or unpredictable conditions. It allows the water heater to smooth out changes in the sensors, circumventing abrupt changes in operation that could result from relying on traditional either-or and all-or-nothing logic.

The heating rates may be stored in memory of the logic unit 132, and may be retrieved by the logic unit 132 for dynamically updating the RATE1 threshold. Once retrieved, the logic unit 132 may apply a function, such as a fractional multiplier of 0.25, to the heating rates to determine the RATE1 threshold. The RATE1 threshold may be determined using other functions, e.g., logarithmic multipliers, or alternatively be set to a fixed number. Further, the heating rates need not be stored in memory of the logic unit 132, but rather, may be retrieved or sent from another source, such as a service or preventive maintenance device via a tethered or wireless connection.

If the first heating rate satisfies the RATE1 threshold, then the logic unit 132 may continue to block 920 via path 922. In block 920, the logic unit 132 clears or decrements (if not zero) a fault counter. Thereafter, the sensor-contact test 440 proceeds to an end block 924 to finish the test. Alternatively, the sensor-contact test 440 may return to the start block 902 so as to repeat the sensor-contact test 440 again.

If the first heating rate does not satisfy RATE1 threshold, then the logic unit 132 determines if the first timer satisfies a heat-timer limit at decision block 926. If the first timer does not satisfy the heat-timer limit, the sensor-contact test 440 loops back to decision block 918. This process is repeated until the first timer satisfies the heat-timer limit, as shown by loop path 928.

After the first timer satisfies the heat-timer limit, the logic unit 132, at decision block 930, compares the heat-timer limit to a minimum-heating-time threshold, which is the minimum value of time for maintaining the heat cycle, e.g., 4 minutes. If the heat-timer limit is greater than the minimum-heating-time threshold, then the sensor-contact test 440 continues to block 932. In block 932, the logic unit 132 adjusts or reduces, e.g., by half, the heat-timer limit for the next cycle of the sensor-contact test 440. The adjustment of the heat-timer limit is made so as to avoid an undesirable increase in water temperatures after multiple, contiguous cycles of the sensor-contact test 440 when one or both of the first and/or second sensors 134, 136 fail.

After reducing the heat-timer limit or if the heat-timer limit is equal to or less than the minimum-heating-time threshold, then the sensor-contact test 440 continues to block 934 in which the logic unit 132 terminates the heat cycle. After terminating the heat cycle, the logic unit 132 waits a predetermined amount of time, e.g., 3 minutes, as shown in block 936. If a water draw is affecting the rate of change of the water temperature during the heat cycle, the water temperatures may decrease at a rate approximately equal to minus one times the first heating rate.

In decision block 938, the logic unit 132 may compare, for example, an absolute value of the second heating rate to a second expected-heating-rate ("RATE2") threshold; although only a single sided threshold may be used. The RATE2 threshold, like the RATE1 threshold, may be a function of historical and/or current maximum heating rates of the water heater 100 that may be retrieved from the memory of the logic unit 132. Once retrieved, the logic unit 132 may dynamically update the RATE2 threshold by applying a function, such as a fractional multiplier of 0.25, to the heating rates. The RATE2 threshold may be determined using other functions, e.g., logarithmic multipliers, or alternatively be set to a fixed number.

If the second heating rate satisfies the RATE2 threshold, then the logic unit 132 may continue to block 920 via path 940. In block 920, the logic unit 132 clears or decrements (if not zero) a fault counter. Thereafter, the sensor-contact test 440 proceeds to an end block 924 to finish the test. Alternatively, the sensor-contact test 440 may return to the start block 902 so as to repeat the sensor-contact test 440 again.

If, on the other hand, the second heating rate does not satisfy the RATE2 threshold, the water heater 100 may be experiencing a problem that does not allow the water to heat, or does not allow the heating effect to be detected. This problem may be caused by, for example, a malfunctioning heater or ignition source, and/or poor sensor contact. Responsively, the logic unit 132 may set a fault condition, as shown in block 942. In this fault condition, the logic unit 132 may (i) halt the water heater from initiating or maintaining a heat cycle, (ii) prevent the water heater from further operation until being serviced and reset, and/or (iii) set the fault indicator module to a fault state as shown in block 942. Alternatively, the logic unit 132 may return to the start 902 to repeat the sensor-contact test 440 again. In such case, the logic unit 132 may increment the fault counter. When the fault counter reaches a predefined number of cycles, the logic unit 132 may set the fault condition shown in block 942.

The sensor-contact test 440 may be performed as a standalone test, integrated with another the tests in the test battery 400 and/or integral to another of the tests in the test battery 400. The sensor-contact 440 may be carried out before, after, and/or in a logical sequence with other tests in the test battery 400. For example, the sensor-contact test 440 may be performed after the sensor-failure test 410 and sensor-position test 420 to ensure that it is performed with properly functioning sensors.

The above-described embodiment of the sensor-contact test 440 is provided for exemplary purposes only. Those skilled in the art will recognize that the sensor-contact test 440 may be in carried out in a different manner, using more or less steps, and in a different order than presented. Moreover, the RATE1 threshold, the heat-timer limit, the minimum-heating-time threshold, the predetermined period, and the RATE2 threshold may differ from the examples provided.

FIG. 10 is a chart 1000 illustrating water temperatures detected by the first and second sensors 134, 136 during an experiment in which an exemplary embodiment of the sensor-contact test 440 is carried out. The chart 1000 also illustrates water temperatures detected by third and fourth sensors 1002, 1004 that are positioned approximately 10 millimeters off the tank 102 to simulate sensor-contact failures. The third sensor 1002 may be positioned in close proximity to the first sensor 134. The fourth sensor 1004 may be positioned in close proximity to the second sensor 136. The chart 1000 also illustrates the operation of the gas-flow valve during the exemplary embodiment of the sensor-contact test 440.

At time $t_0$, a heat cycle is initiated. The water temperatures detected by the first, second, third and fourth sensors 134, 136, 1002, 1004 between time $t_1$ to time $t_2$ illustrate the heating rate of the water during the heat cycle. In the water heater tested, the physical characteristics allow the heating rate of water to be about equal to the cooling rate of the water. In this case, the heating rate is about constant, and thus, the cooling rate may be about constant. At time $t_2$, the gas-flow valve is temporarily turned off. Between time $t_2$ and $t_3$, the logic unit 132 determines a cooling rate that is in excess of the RATE1 threshold. Consequently, the logic unit 132 turns the gas-flow valve back on and heats the water, as known between time $t_3$ and time $t_4$.

Between times $t_4$ and $t_5$, the logic unit 132 repeatedly (i) turns off the gas-flow valve for a short duration (reducing the on time in each cycle), (ii) detects the water temperatures detected by the first, second, third and fourth sensors 134, 136, 1002, 1004, (iii) determines a cooling rate in excess of the RATE2 threshold, and/or (iv) returns to the start 902 of the sensor-contact test 440. At time $t_5$ the water draw stops. The water heats to the desired setpoint and the heater 108 turns off. The logic unit 132 keeps the gas-flow valve off for an extended amount of time because it detects a cooling rate that is not in excess of the RATE2 threshold. Between time $t_5$ and time $t_6$, the logic unit 132 detects water temperatures for the first, second, third and fourth sensor 134, 136, 1002, and 1004.

As can be readily discerned from FIG. 10, the water temperatures detected by, and the cooling rate of the first and second sensors 134, 136 are about equal. On the other hand, the water temperatures detected by the third and fourth sensors 902, 904 not only differ from each other, but are different than the water temperatures of the first and second sensors 134, 136. These differences may be indicative of loss of contact with the tank 102.

3. Conclusion

In the foregoing detailed description, numerous specific details are set forth in order to provide a thorough understanding of exemplary embodiments described herein. However, it will be understood that these embodiments may be practiced without the specific details. In other instances, well-known methods, procedures, components and circuits have not been described in detail, so as not to obscure the forgoing description. Further, the embodiments disclosed are for exemplary purposes only and other embodiments may be employed in lieu of or in combination with of the embodiments disclosed.

The exemplary embodiments described herein may be deployed in various equipment and other devices, which may include or be utilized with any appropriate voltage source, such as a battery, an alternator and the like, providing any appropriate voltage, such as about 0.4, 5, 12, 24, 42 Volts DC (VDC), 120 Volts AC, and the like. Further, the embodiments described herein may be used with any desired fuel source, such as natural gas, propane and the like, and hybrids or combinations thereof.

In the embodiments described above, the devices and systems may include computing systems, controllers, and other devices containing processors. These devices may contain at least one Central Processing Unit ("CPU") and a memory. In accordance with the practices of persons skilled in the art of computer programming, reference to acts and symbolic representations of operations or instructions may be performed by the various CPUs and memories. Such acts and operations or instructions may be referred to as being "executed," "computer executed" or "CPU executed."

One of ordinary skill in the art will appreciate that the acts and symbolically represented operations or instructions include the manipulation of electrical signals by the CPU. An electrical system represents data bits that can cause a resulting transformation or reduction of the electrical signals and the maintenance of data bits at memory locations in a memory system to thereby reconfigured or otherwise alter the CPU's operation, as well as other processing of signals. The memory locations where data bits are maintained are physical locations that have particular electrical, magnetic, optical, or organic properties corresponding to or representative of the data bits. It should be understood that the exemplary embodiments are not limited to the above-mentioned platforms or CPUs and that other platforms and CPUs may support the described methods.

The data bits may also be maintained on a computer readable medium including magnetic disks, optical disks, and any other volatile (e.g., Random Access Memory ("RAM")) or non-volatile (e.g., Read-Only Memory ("ROM")) mass storage system readable by the CPU. The computer readable medium may include cooperating or interconnected computer readable medium, which exist exclusively on the processing system or are distributed among multiple interconnected processing systems that may be local or remote to the processing system.

In view of the wide variety of embodiments to which the principles of the present invention can be applied, it should be understood that the illustrated embodiments are exemplary only, and should not be taken as limiting the scope of the present invention. For example, the method steps described may be taken in sequences other than those described, and more or fewer elements may be used in the block diagrams.

Further, the claims should not be read as limited to the described order or elements unless stated to that effect. In addition, use of the term "means" in any claim is intended to invoke 35 U.S.C. §112, ¶ 6, and any claim without the word "means" is not so intended. Therefore, all embodiments that come within the scope and spirit of the following claims and equivalents thereto are claimed as the invention.

Preferred and alternative embodiments of the present invention have been illustrated and described. It will be understood, however, that changes and modifications may be made to the invention without deviating from its true spirit and scope, as defined by the following claims.

What is claimed is:

1. In a water heater having a first sensor, a second sensor, and a logic unit, wherein each of the first and second sensors are operable to provide an output indicative of water temperature, and wherein the logic unit uses the output indicative of water temperature to control heat cycling of the water heating device, a method for performing a sensor-matching test comprising:

the logic unit performing a test on at least one of the first and second sensors so as to produce a test output;

the logic unit determining whether the test output satisfies at least one predetermined threshold, wherein the at least one predetermined threshold is indicative of a properly-functioning sensor; and the logic unit setting a fault condition indicative of a non-properly-functioning sensor when the test output does not satisfy the at least one predetermined threshold, wherein the step of performing the test on the at least one of the first and second sensors so as to produce a test output comprises:

(a) performing a heat cycle;

(b) using the first and second sensors to detect respective first and second water temperatures after the heat cycle completes;

(c) determining a first differential between the first and second water temperatures;

(d) using the first and second sensors to detect respective third and fourth water temperatures after the water heater has been idle for a predetermined period of time; and (e) determining a second differential between the third and fourth water temperatures; and wherein the step of determining whether the test output satisfies the at least one predetermined threshold comprises determining whether the first differential is greater than a first differential threshold and whether the first differential minus the second differential is greater than a second differential threshold, and wherein the step of setting the fault condition indicative of the non-properly-functioning sensor comprises setting the fault condition if the first differential is not greater than the first differential threshold.

2. The method of claim 1, further comprising:

(a) performing a second heat cycle after determining that the first temperature differential minus the second temperature differential is greater than the second threshold;

(b) using the first and second sensors to detect first and second water temperatures after the second heat cycle completes; and (c) determining a third differential between the first and second water temperatures, wherein the step of determining whether the test output satisfies the at least one predetermined threshold comprises determining whether the second differential minus the third differential is greater than a third differential threshold, wherein the third differential threshold is indicative of a small temperature differential, and wherein the step of setting the fault condition indicative of the non-properly-functioning sensor further comprises setting the fault condition if the second differential minus the third differential is less than the third differential threshold.

3. The method of claim 1, wherein the step of setting the fault condition indicative of the non-properly-functioning sensor further comprises setting the fault condition if the second differential is not less than the second differential threshold.

4. The method of claim 3, wherein the second differential threshold is a function of a combination a desired setpoint temperature and an ambient temperature divided by a constant.

5. The method of claim 4, wherein the step of determining whether the second differential is not less than the second differential threshold comprises determining whether the desired setpoint temperature minus the second differential threshold is greater than a fixed temperature threshold.

6. In a water heater having a first sensor, a second sensor, and a logic unit, wherein each of the first and second sensors are operable to provide an output indicative of water temperature, and wherein the logic unit uses the output indicative of water temperature to control heat cycling of the water heating device, a method for determining a health status of the water heater comprising:

the logic unit performing a sensor-contact test on at least one of the first and second sensors so as to produce a test output;

the logic unit determining whether the test output satisfies at least one predetermined threshold, wherein the at least one predetermined threshold is indicative of a properly-functioning sensor; and the logic unit setting a fault condition indicative of a non-properly-functioning sensor when the test output does not satisfy the at least one predetermined threshold, wherein the steps of (i) performing the test on at least one of the first and second sensors so as to produce the test output, and (ii) determining whether the test output satisfies the at least one predetermined threshold comprise:

(a) initiating a heat cycle;
(b) using the first and second sensors to detect first and second water temperatures after a heat cycle initiates;
(c) determining a heating rate using the first and second water temperatures;
(d) determining whether the heating rate satisfies an expected-heating-rate threshold;
(e) repeating steps (b)-(d) if the heat cycle has not been occurring for a first predetermined period;
(f) completing the heat cycle;
(g) waiting a second predetermined period;
(h) using the first and second sensors to detect third and fourth water temperatures;
(i) determining a cooling rate using the third and fourth water temperatures; and
(j) determining whether the cooling rate satisfies an expected-cooling-rate threshold, wherein the step of setting the fault condition indicative of the non-properly-functioning sensor comprises setting the fault condition when the heating rate does not satisfy the expected-heating-rate threshold.

7. The method of claim 6, wherein the step of setting the fault condition indicative of the non-properly-functioning sensor comprises setting the fault condition when the cooling rate does not satisfy the expected-cooling-rate threshold.

* * * * *

UNITED STATES PATENT AND TRADEMARK OFFICE
CERTIFICATE OF CORRECTION

PATENT NO. : 7,804,047 B2 Page 1 of 1
APPLICATION NO. : 10/997258
DATED : September 28, 2010
INVENTOR(S) : Zak et al.

It is certified that error appears in the above-identified patent and that said Letters Patent is hereby corrected as shown below:

At item (*) of the cover page (just above item (21)):

Please delete "This patent is subject to a terminal disclaimer."

Signed and Sealed this

Seventh Day of December, 2010

David J. Kappos
*Director of the United States Patent and Trademark Office*